US011728130B2

United States Patent
Zeidler et al.

(10) Patent No.: US 11,728,130 B2
(45) Date of Patent: Aug. 15, 2023

(54) METHOD OF RECORDING AN IMAGE USING A PARTICLE MICROSCOPE

(71) Applicant: Carl Zeiss SMT GmbH, Oberkochen (DE)

(72) Inventors: Dirk Zeidler, Oberkochen (DE); Thomas Korb, Schwaebisch Gmuend (DE); Philipp Huethwohl, Ulm (DE); Jens Timo Neumann, Aalen (DE); Christof Riedesel, Aalen (DE); Christian Wojek, Aalen (DE); Joaquin Correa, Oakland, CA (US); Wolfgang Hoegele, Stephanskirchen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 12 days.

(21) Appl. No.: 17/220,519

(22) Filed: Apr. 1, 2021

(65) Prior Publication Data

US 2021/0296089 A1   Sep. 23, 2021

Related U.S. Application Data

(63) Continuation of application No. PCT/EP2019/076637, filed on Oct. 1, 2019.
(Continued)

(30) Foreign Application Priority Data

Oct. 2, 2018   (DE) .......................... 102018124401.0

(51) Int. Cl.
  *H01J 37/28*   (2006.01)

(52) U.S. Cl.
  CPC ......... *H01J 37/28* (2013.01); *H01J 2237/063* (2013.01); *H01J 2237/221* (2013.01); *H01J 2237/2806* (2013.01)

(58) Field of Classification Search
  CPC .. H01J 37/00; H01J 37/02; H01J 37/26; H01J 37/28; H01J 37/222; H01J 2237/063;
  (Continued)

(56) References Cited

U.S. PATENT DOCUMENTS 6,834,128 B1   12/2004   Altunbasak et al.
7,034,296 B2   4/2006   Sato et al.
(Continued)

FOREIGN PATENT DOCUMENTS

DE   10315592 A1   10/2004
DE   102015013698 A1   4/2017
(Continued)

OTHER PUBLICATIONS

Korean Office Action, with translation thereof, for corresponding KR application No. 10-2021-7013146, dated Apr. 22, 2022.
(Continued)

*Primary Examiner* — Jason L McCormack
(74) *Attorney, Agent, or Firm* — Fish & Richardson P.C.

(57) ABSTRACT

A method, including: recording plural images of an object by scanning plural particle beams across the object and detecting signals generated by the particle beams, wherein the plural particle beams are generated by a multi-beam particle microscope; determining plural regions of interest; determining plural image regions in each of the recorded images; determining plural displacement vectors; and determining image distortions based on image data of the recorded images and the determined displacement vectors.

26 Claims, 8 Drawing Sheets

Related U.S. Application Data

(60) Provisional application No. 62/888,866, filed on Aug. 19, 2019.

(58) Field of Classification Search
CPC ......... H01J 2237/221; H01J 2237/2806; H01J 2237/226; G06T 2207/10056; G06T 2207/30148; G06T 2207/10061; G06T 5/003; G06T 5/50; G06T 7/246
USPC ........................................ 250/306, 307, 311
See application file for complete search history.

(56) References Cited

U.S. PATENT DOCUMENTS

| | | | |
|---|---|---|---|
| 9,536,702 B2 | 1/2017 | Lang et al. | |
| 9,762,863 B2 | 9/2017 | Potocek et al. | |
| 2004/0197017 A1 | 10/2004 | Olschewski et al. | |
| 2005/0141081 A1 | 6/2005 | Olschewski | |
| 2006/0289804 A1 | 12/2006 | Knippelmeyer et al. | |
| 2010/0246993 A1 | 9/2010 | Rieger et al. | |
| 2012/0045790 A1 | 2/2012 | Van Dijk et al. | |
| 2012/0300054 A1* | 11/2012 | Mito | G01B 15/04 382/199 |
| 2014/0226003 A1 | 8/2014 | Phaneuf et al. | |
| 2014/0283227 A1 | 9/2014 | Mosley et al. | |
| 2015/0348749 A1 | 12/2015 | Lang et al. | |
| 2016/0247663 A1 | 8/2016 | Schubert et al. | |
| 2016/0300689 A1* | 10/2016 | Tromp | H01J 37/28 |
| 2017/0117114 A1 | 4/2017 | Zeidler | |
| 2019/0019274 A1 | 1/2019 | Han et al. | |

FOREIGN PATENT DOCUMENTS

| | | |
|---|---|---|
| DE | 102017212214 A1 | 1/2019 |
| EP | 1548485 A1 | 6/2005 |
| EP | 2197018 A1 | 6/2010 |
| EP | 2707893 A1 | 3/2014 |
| EP | 3053183 A1 | 8/2016 |
| JP | 2007-298397 A | 11/2007 |
| WO | WO2005024881 A2 | 3/2005 |

OTHER PUBLICATIONS

W. Lauterborn et al., "Kohärente Optik—Grundlagen für Physiker und Ingenieure" (Coherent Optics—Foundations for Physicists and Engineers), Section A.1, Heidelberg 1993, pp. 289-291.

Japanese Office Action, with translation thereof, for corresponding JP application No. 2021-518103, dated Jun. 1, 2022.

German Office Action, with translation thereof, for corresponding DE application No. 10 2018 124 401.0 dated Jun. 29, 2019.

P. Cizmar et al., "Real-Time Scanning Charged-Particle Microscope Image Composition with Correction of Drift", Microscopy and Microanalysis, 17(2), 2011, pp. 302-308.

N. Marturi et al., "Fast Image Drift Compensation in Scanning Electron Microscope using Image Registration", IEEE International Conference on Automation Science and Engineering, CASE '13., 2013, pp. 1-6.

P. Jin et al., "Correction of image drift and distortion in a scanning electron microscopy", Journal of Microscopy, vol. 260, Issue 3, 2015, pp. 268-280.

M. Karuppasamy et al., "Non-rigid image registration to reduce beam-induced blurring of cryo-electron microscopy images", Journal of Synchrotron Radiation, vol. 20, 2013, pp. 1-9.

D. Zhang et al., "Fast, Full Chip Image Stitching of Nanoscale Integrated Circuits", Computer Science, 2019, pp. 306-310.

International search report for corresponding international application No. PCT/EP2019/076637 dated Feb. 25, 2020.

\* cited by examiner

METHOD OF RECORDING AN IMAGE USING A PARTICLE MICROSCOPE

CROSS-REFERENCE TO RELATED APPLICATIONS

The present application is a continuation of, and claims benefit under 35 USC 120 to, international application PCT/EP2019/076637, filed Oct. 1, 2019, which claims benefit under 35 USC 119 of German Application No. 10 2018 124 401.0, filed Oct. 2, 2018 and of U.S. Provisional Application No. 62/888,866, filed Aug. 19, 2019. The entire disclosures of these applications are incorporated by reference herein.

FIELD

The present disclosure relates to methods of recording images using particle microscopes.

BACKGROUND

Particle microscopes typically include an object mount for mounting an object to be imaged, and a particle beam column generating one or more particle beams and directing the one or more particle beams onto the objects. Signals generated by the particles incident on the object are detected such that intensity values of the detected signals can be associated with locations on the object where the signals were generated. The collected intensity values and the locations on the object associated with the intensity values represent an image of the object which can be displayed on a screen, which can be analyzed, or which can be stored for other purposes, for example.

Since the detected signals are affected by signal noise, it is desirable to collect a sufficient amount of signals from a region of the object to be imaged, in order to obtain an image having a desired image resolution and image quality. The collecting of the signals involves a significant amount of time. It may happen in practice that the object mount holding the object moves relative to the particle beam column while the signals for generating the image are collected. Such movement may be caused by mechanical instabilities, thermal drifts or other reasons. Such movements result in that the association of detected signals with locations on the object is not sufficiently well defined and in that the resulting image can be blurred or distorted. Moreover, the particles incident on the object and the particles leaving the object and forming detected signals generate surface charges on the object. Surface charges may result in image artifacts in the generated images.

According to a conventional method, plural images of the object are sequentially recorded, wherein each of the recorded images has a lower image quality than a resulting image which is calculated based on a combination or superposition of the recorded images. Such a method takes movements of the object holder relative to the particle beam column during the recording of the subsequent images into account when the individual recorded images are combined or superposed to form the resulting image. Herein, computer assisted image processing can be used to determine the displacements between recorded images. For example, such determination may include a method of correlating the recorded images. Examples of such methods are illustrated in U.S. Pat. No. 7,034,296 B2.

Computer assisted image processing may thus generate an image of higher quality based on plural recorded images of lower image quality. The image of higher quality may show, for example, a higher contrast to noise ratio. For example, the image of the higher quality may show a lower image blur as compared to images obtained by conventional superposition. Image blur may affect images of higher quality if, for example, drifts are involved during the recording of the images of the lower quality and when such drifts are not correctly accounted for when the lower quality images are combined to form the higher quality image. Moreover, the image of the higher quality may show a higher contrast-to-noise ratio than each of the lower quality images.

Moreover, the question was raised whether it might be possible to reduce image artifacts generated due to surface charges in particle optical images by using computer assisted image processing.

SUMMARY

The present disclosure has been made taking the above considerations into account.

The present disclosure seeks to provide methods for recording images using a particle microscope in which computer assisted image processing provides improved image qualities.

Embodiments of the disclosure provide methods for recording images using a particle microscope, wherein the methods include recording of plural images of an object using the particle microscope.

The recorded image is represented by a data record. The data record may include metadata, such as time, location, type of the inspected object, magnification, coordinates of the imaged object region in a coordinate system of the object or a coordinate system of the particle microscope and other items. The recorded image further includes image data, wherein the image data include a plurality of intensity values, wherein each intensity value is associated with a location in a coordinate system of the recorded image and with a location on the object.

Each intensity value may represent, for example, a number of detected signals detected during a given duration while a particle beam of the particle microscope was directed to a same location on the object (dwell time). The detected signals can be detected events due to detection of secondary electrons, backscattered electrons, x-rays, light and other events generated by the particles of the particle beam when they hit the object.

According to exemplary embodiments, the location on the object associated with a given intensity value is the location on the object onto which the particle beam was actually directed while the signals for determining the given intensity value were collected.

According to exemplary embodiments, the location in the coordinate system of the recorded image associated with a given intensity value corresponds to the location on the object which is also associated with the given intensity value. The association can be, for example, a correspondence represented by a coordinate transform allowing to calculate the location on the object in a coordinate system of the object based on the location in the coordinate system of the image. A suitable coordinate transform can be determined, for example, based on a measured position of the object relative to the particle microscope, the magnification of the microscope and other data.

The location in the coordinate system of the recorded image can be transformed into a corresponding location in the coordinate system of the object using simplifying assumptions, accordingly. According to one simplifying assumption, the position of the object relative to the particle microscope is known or does at least not change while the image is recorded. In the practice, the object may move relative to the particle microscope, or the position of the particle beam relative to the particle microscope may change unexpectedly while the image is recorded, such that the particle beam is incident on the object at a location different from an expected location since the amount of the displacement might not be known. In such situation, the location in the coordinate system of the recorded image represents the location in the coordinate system of the object with a reduced accuracy. The beam is incident on a location of the object which is known with only a limited accuracy, and this location of the object is associated with the intensity value since the beam is incident on the object at this location.

The location in the coordinate system of the recorded image associated with a given intensity value can be determined based on, for example, excitations applied to beam deflectors of the particle microscope while the signals for determining the given intensity value are detected. The excitations of the deflectors are applied in order to direct the particle beam to desired locations on the object.

The intensity values representing an image can be stored, for example, as a two-dimensional matrix having integer indices representing the locations in the coordinate system of the recorded image. It is, however, also possible to store each recorded intensity value together with two additional values representing the location in the coordinate system of the recorded image. These values can be represented by integer numbers or floating point numbers, for example.

According to exemplary embodiments, the method of recording the image may include a determination of plural regions of interest, wherein at least one location on the object is associated with a given region of interest.

For example, the regions of interest can be predetermined in the coordinate system of the object. For example, the regions of interest can be regions of the object which are expected to contain a significant feature. If, for example, the object is an integrated circuit, the regions of interest can be determined based on available design data of the integrated circuit providing information on locations in the integrated circuit where a selected feature of the circuit can be found. The selected circuit elements are preferably circuit elements which can be identified and localized in the particle optical image with a high contrast. According to a further example, positions of the regions of interest are determined based on an analysis of the recorded image itself. For example, one or more of the recorded images can be analyzed in order to determine where a region is located in the recorded image having assigned image data representing an image portion including a feature having a high contrast. These determined regions of interest can be associated with the object and contain at least one location of the object and, generally, a plurality of locations of the object.

According to further embodiments, the method of recording the image includes a determination of plural image regions in each of the recorded images, wherein each of these image regions is associated with one of the plural regions of interests. The plural image regions are determined such that each of the image regions includes intensity value of the recorded image assigned to a location within a neighborhood of the location of the object which is also associated with the region of interest located in this image region.

The image regions can be extended regions in the coordinate system of the recorded image. In the context of the present application, image regions "include" or "contain" image data. This means that the image data are regarded as the image data of the image region when the image data of the recorded image associated with locations in the coordinate system of the recorded image are located within the extended region.

When the regions of interest of the object are, for example, elements of an electronic circuit, each image region of a given recorded image can be selected such that those image data of the recorded image are associated with the image region which include intensity values assigned to locations on the object located in the neighborhood of locations of the object associated with the corresponding region of interest. This can be fulfilled, for example, when each of the plural image regions of the recorded images at least partially overlap with the regions of interest of the object in a representation of the recorded images. It is not required, however, that the image regions are always located at corresponding positions in the coordinate system of the recorded images. This may in particular occur when the regions of interest are determined based on an analysis of the recorded images, or when the object is moved relative to the particle microscope while the plural images are recorded. If the regions of interest of the object are, for example, predetermined in the coordinate system of the object, the image regions of the recorded images assigned to the regions of interest can be determined using a coordinate transform taking the position of the object relative to the particle microscope, the magnification and other data into account.

According to further exemplary embodiments, the method of recording the image includes determining of displacement vectors associated with at least some of the image regions of the plural image regions. Herein, a displacement vector associated with a given image region is determined based on a correlation of the image data of the given image region with image data of another image region or plural other image regions. In particular, the image regions which are correlated with each other may be associated with a same region of interest of the plural regions of interest. The image regions which are correlated with each other can be image regions of different recorded images, for example.

The correlating of image data of one image region with image data of another image region includes a computation which can be represented by a mathematical function, for example. The mathematical function may receive the image data of the image regions to be correlated as input parameters and may calculate an output based on these input parameters. The output can be a scalar value, a tuple of scalar values, such as a vector, and image data, for example. One example of such function is a function determining a displacement vector between two image regions by performing a convolution using a two-dimensional Fourier transform. Examples of such computational methods are illustrated in section A.1 of Lauterborn et al., *Kohärente Optik—Grundlagen für Physiker and Ingenieure*, Berlin Heidelberg 1993.

For example, the following steps can be performed for each region of interest: first, those image regions of the recorded images which are associated with the regions of interest of the object are determined. This means that features of the object located in the regions of interest are also visible in image representations generated based on the image data contained in the determined image regions. In the representations of the image regions, the features of the objects are generally not always located at the same positions of the image regions. This is because the correspondence between the regions of interest of the object and the corresponding image regions of the recorded images is known with only a limited accuracy due to displacements of the object relative to the particle microscope, for example. The displacement vectors determined based on the correlation of the image data represent such displacements. Moreover, the displacement vectors make it possible to displace the locations assigned to the intensity values of the image regions in the coordinate system of the recorded images by the respective displacement vector, such that, subsequent to the displacement, the intensity values of image regions of different recorded images are associated with a same location on the object.

Accordingly, it is possible to combine the image data of the image regions including image data representing images of a given quality to form an image having image data representing an image of a higher quality by taking the displacement vectors into account.

According to exemplary embodiments, the method of recording the image further includes a generation of a resulting image by assigning the image data of the recorded images to the resulting image, wherein one or more intensity values of the plural intensity values of each image region are associated with locations in the coordinate system of the resulting image, wherein the locations in the coordinate system of the resulting image are calculated based on the displacement vectors associated with the image regions.

In a given recorded image having image regions associated with different displacement vectors, the image data contributing to the resulting image are displaced by different amounts depending on their position within the recorded image. At least some intensity values which are associated with locations within the predetermined image region in the coordinate system of the recorded image are displaced by a vector which is equal to the displacement vector associated with this image region or which is calculated based on this displacement vector. Vectors for displacing locations of other intensity values can be determined, for example, based on the whole set of displacement vectors associated with the image regions of the recorded image. According to another example, the vectors for displacing locations of other intensity values can be determined by interpolation and/or extrapolation between such displacement vectors. According to some examples, the displacement vectors for displacing locations of other intensity values can be determined by fitting parameters of a set of selected two-dimensional basis functions to the displacement vectors determined based on individual regions of interest. The displacement at a given location can be calculated applying the parameterized set of basis functions to the given location. The basis functions may selected to describe characteristic distortion effects of the microscope, such as image rotation and quadratic or higher order deviations.

The illustrated methods for recording the image can be advantageously used in situations in which the locations where the particle beam is incident on the object during the recording of the plural images deviate from those locations at which the particle beam is expected to be incident on the object, and wherein these deviations are not the same for all locations of the recorded images, such that the deviations in the coordinate system of the recorded images differ locally. This may happen, for example, when localized surface charges on the object generate deflections of the incident particle beam which are not the same for all locations of the object. In such situation, the illustrated method provides a flexible approach to displace the image data of each recorded image based on different displacement vectors such that a resulting image having a high quality and low image blur can be generated.

The plural images of the object can be recorded using a particle microscope generating one single particle beam or multi-beam particle microscopes generating an array of plural particle beams. The illustrated methods can be particularly useful for particle microscopes generating plural particle beams since the individual particle beams may experience drifts or other deflections relative to other particle beams which may, in particular, depend on time. It is then possible to determine the image regions in each of the recorded images such that the image data of each image region are generated by only one particle beam. In other words, a displacement vector can be associated with each particle beam wherein this displacement vector may even take temporal changes of deflections of individual particle beams relative to other particle beams into account in order to allow a superposition of the individual recorded images to form a resulting image having a high quality.

According to further exemplary embodiments, a method of recording an image using a multi-beam particle microscope includes scanning an array of plural particle beams across a surface of an object and detecting signals generated by the particles of the particle beams incident on the object, wherein adjacent particle beams are scanned across adjacent object regions, and wherein pairs of adjacent object regions overlap. The method may further include generating plural images based on the detected signals such that each image is based on the detected signals generated by a single particle beam of the plurality of particle beams, wherein each image is an image of a corresponding surface region. The method may further include determining of plural image regions in each image such that an object portion of the object imaged into a given image region of a first image is also imaged into an image region of a second image, wherein the first and second images are generated based on detection signals generated by adjacent particle beams. The method may further include correlating image data of pairs of image regions of the images, wherein each pair of image regions is selected such that a same object portion of the object is imaged into both image regions of the pair of image regions. The method may further include determining image distortions of the plural images based on the correlating of the image data and generating a combined resulting image based of the plural images and the determined image distortions.

BRIEF DESCRIPTION OF THE DRAWINGS

Embodiments of the disclosure will be illustrated with reference to the figures, in which.

DESCRIPTION OF EXEMPLARY EMBODIMENTS

Figure 1:
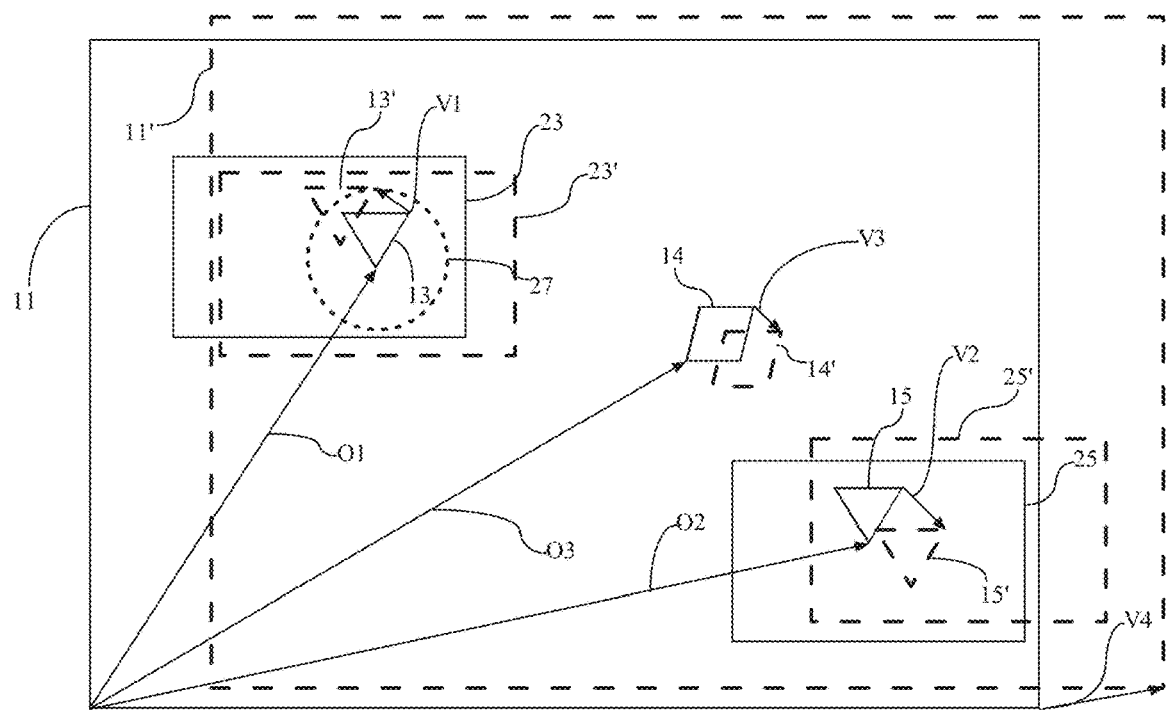
FIG. 1 is a schematic presentation illustrating a method of recording an image using a particle microscope.
Figure 2:
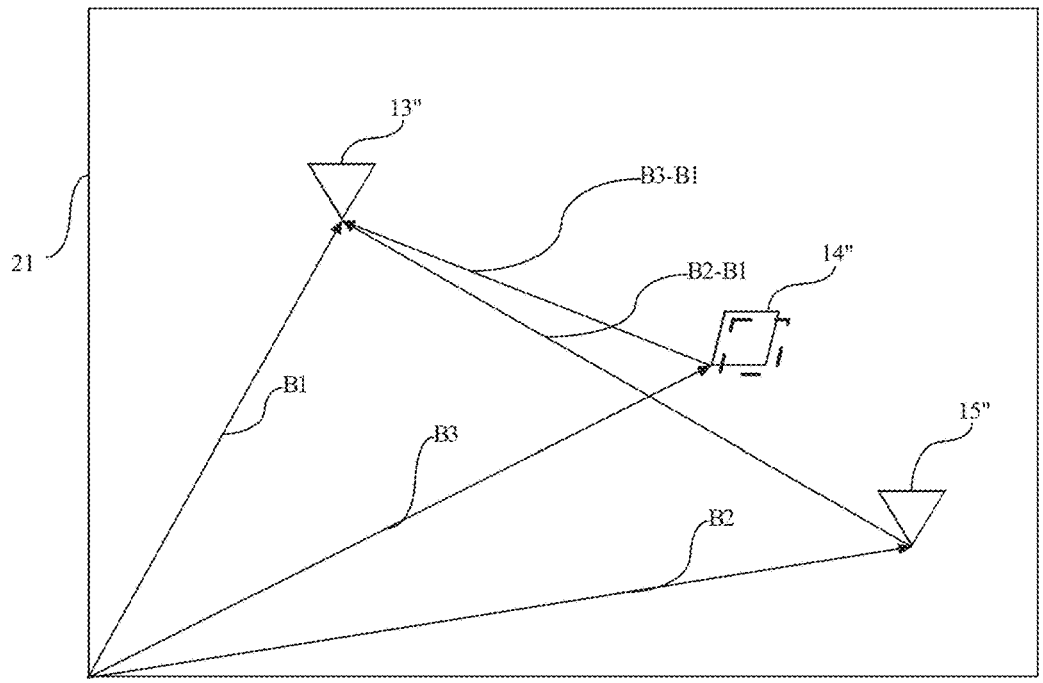
FIG. 2 is a further schematic presentation illustrating the method of FIG. 1.

An embodiment of a method of recording an image using a particle microscope will be illustrated with reference to FIGS. 1 and 2 below. FIG. 1 is a schematic presentation showing details of images recorded using the particle beam microscope, and FIG. 2 is a schematic presentation illustrating details of a resulting image obtained from the recorded images of FIG. 1.

A rectangle 11 drawn with solid lines in FIG. 1 represents a first recorded image recorded using the particle microscope, and a rectangle 11' drawn with dotted lines in FIG. 1 represents a second recorded image recorded using the particle microscope subsequent to the recording of the first recorded image 11. Each of the recorded images 11, 11' includes image data including a plurality of intensity values, wherein each intensity value is associated with a location in a coordinate system of the recorded image and a location on the object.

The intensity values are obtained from measurements in which the particle beam is directed onto the object and while signals generated by the particle beam incident on the object are detected. The intensity values represent the intensity of these detected signals. For example, the particle beam can be systematically scanned across the object, and an intensity value can be determined for each scan position. In such situation, it can be advantageous to store the intensity values as a two-dimensional array, wherein the array contents are determined by the intensity values while the array indices represent the location in the coordinate system of the recorded image associated with the respective intensity value. The array contents are then typically referred to as "pixels" of the recorded image. It is, however, also possible to store each intensity value together with two additional values representing the coordinates of the intensity value in the recorded image. This can be advantageous if the particle beam of the particle microscope is sequentially directed to locations on the object which are not arranged in a regular array of lines and columns as it is the case in a raster scanning method.

In this illustrative example, the object from which the recorded images 11 and 11' were obtained is assumed to have a simplified uniform structure with three salient features represented in FIG. 1 as triangles and diamonds. A first one of the three features is represented in the first recorded image 11 by a triangle 13 represented by solid lines. This same feature of the object is represented in the second recorded image 11' as a triangle 13' represented by broken lines. It is apparent that the salient features 13 and 13' in the recorded images 11 and 11', respectively, do not coincide even though they are obtained from measurements of the same feature of the object. In the representation of FIG. 1, the elements 13 and 13' in the recorded images 11 and 11', respectively, have corresponding shapes in that the feature 13 coincides with the feature 13' if it is translated by a vector V1.

A further salient feature of the object is represented in the first recorded image 11 as a triangle 15 represented by solid lines, while it is represented in the second recorded image 11' as a triangle 15' represented by broken lines. Again, the features 15 and 15' in the recorded images 11 and 11', respectively, do not coincide, even though they are obtained from measured intensity values associated to the same locations on the object. A vector V2 in FIG. 1 represents a displacement for displacing the feature 15 of the recorded image 11 such that it coincides with the feature 15' of the recorded image 11'.

Similarly, FIG. 1 shows a further feature of the object which is represented in the first recorded image 11 as a diamond 14 drawn by solid lines, and which is represented in the second recorded image 11' as a diamond 14' drawn by dotted lines. A displacement vector V3 indicates a displacement for displacing the feature 14 such that it coincides with the feature 14'. In the illustrative example shown in FIG. 1, even the outer boundaries of the recorded images represented by the rectangles 11 and 11' do not coincide. A vector V4 represents a displacement for displacing the rectangle 11 such that it coincides with the rectangle 11'. The displacement V4 can be caused by a movement of the object relative to the particle microscope occurring between the start of the recording of the first recorded image 11 and the start or end of the recording of the second recorded image 11', for example. Such movement can be caused, for example, by unavoidable drifts, such as drifts caused by temperature changes, or by intentional displacements if the object holder holding the object is moved relative to the particle microscope.

It is also apparent from FIG. 1 that the displacement vectors V1, V2 and V3 differ with respect to their amounts and directions. This can be caused, for example, by localized surface charges on the object which can be generated by the incident particle beam. Herein, the amounts and distributions across the object of the localized surface charges can be time dependent, depend on the scanning strategy used for the particle beam, and the time dependent localized surface charges may deflect the incident particle beam such that it is incident on the object at locations which deviate from the expected locations at which the particle beam should be incident based on the current operation conditions of the particle microscope and when the localized surface charges were not present. Therefore, it may be impossible to represent a coordinate transformation between the coordinate system of a recorded image and the coordinate system of the object by an affine transformation.

It is apparent that the differences between the displacement vectors V1, V2 and V3 are caused by the measurement. The displacement vector V4 can be arbitrarily selected, however. A change of the displacement vector V4 results in a corresponding change of the displacement vectors V1, V2 and V3, wherein the differences between the displacement vectors V1, V2 and V3 are maintained. In the example of FIG. 1, the displacement vector V4 is selected such that the sum of the amounts of the vectors V1 and V2 is minimized. This is based on the assumption that the elements 13, 13', 15 and 15' originate from measurements of features on the object which do not move relative to each other while the recorded images 11 and 11' are recorded.

FIG. 2 is a schematic representation of a resulting image 21 obtained from the recorded images 11 and 11'. The resulting image 21 is obtained by combining the image data of the recorded images 11 and 11'.

If the recorded images 11 and 11' were combined using a conventional method, the locations assigned to the intensity values of the first recorded image 11 in the coordinate system of the first recorded image 11 would be displaced by the displacement vector V4 in order to provide the locations in the coordinate system of the resulting image 21 assigned to the intensity values of the first recorded image 11. The locations associated with the intensity values of the second recorded image 11' in its coordinate system can be used unchanged without further displacement as the locations of these intensity values in the resulting image 21.

It is apparent that the intensity values originating from the feature 13 in the first recorded image 11 will then not coincide with the intensity values originating from the feature 13' in the second recorded image 11'. As a consequence, that the feature of the object which is represented in the recorded images 11 and 11' as feature 13 and feature 13', respectively, appears to be blurred in the resulting image. The same applies to the features of the object which are represented in the recorded images 11 and 11' as features 15 and 14 and 15' and 14', respectively.

The illustrated exemplary method for combining the image data of the recorded images 11 and 11' to form the resulting image 21 takes the problems illustrated above into account and allows to provide a resulting image 21 in which representations of features of the object appear sharper and less blurred.

For this purpose, the regions of interest of the object are determined. The regions of interest of the object can be regions of the object containing suitable elements. Suitable elements can be features of the object which can be readily identified in particle microscopic images, for example. Suitable features are, for example, features which can be identified in the recorded images, wherein the positions of the features in the images can be determined with a high accuracy. Non-periodic features which have a sufficient size and which can be represented in the recorded image with a high contrast are examples for suitable features. In the illustrative example discussed above reference to FIG. 1, two regions of interest are determined. The two regions of interest contain the features of the object which are represented in the recorded images 11 and 11' as triangles 13, 13', 15 and 15'. At least one location of the object is assigned to each region of interest. In practice, a large number of locations can be assigned to the region of interest since the regions of interests have a lateral extension on the object which is greater than zero. For example, the regions of interest can be selected such that suitable features on the object having a lateral extension are completely contained within the regions of interest and are features of interest, accordingly.

Subsequent to the determination of the plural regions of interest of the object, plural image regions are determined in the recorded images 11, 11'. The determined image regions in the recorded image 11 are represented in FIG. 1 as rectangles 23 and 25 represented by full lines, and the determined image regions in the recorded image 11' are represented as rectangles 23' and 25' represented by dotted lines in FIG. 1. Each of the image regions 23, 23', 25 and 25' is associated with exactly one region of interest of the object.

Each of the image regions is determined such that one of the regions of interest of the object is contained, in the recorded image, within the image region. For example, the image region 23 in the recorded image 11 is determined such that one of the regions of interest of the object is located within the image region 23. In this example, the region of interest of the object located within the image region 23 is the region of interest shown in FIG. 1 as the triangle 13. The recorded image 11 contains an intensity value which has been selected for illustration purposes at the apex of the triangle 13 and which is associated with a location having coordinates in the coordinate system of the recorded image 11 represented by the vector O1 in FIG. 1. This intensity value also is associated with a location on the object located at the apex of the triangular feature.

The above illustration assumes that an intensity value has been really measured which is associated with exactly that location on the object which is also associated with the region of interest of the object. Applied to the example of FIG. 1, this means that, when the at least one location on the object which is associated with the region of interest is the lower apex of the triangular feature on the object, also an intensity value has to be obtained which is associated with exactly this location, by directing the particle beam onto exactly this location. In practice, this is not necessarily the case, since the particle beam can be directed to one or more locations which are located in the closer neighborhood of this location. Such neighborhood is represented in FIG. 1 by a circle 27.

Summarized, the image region 23 of the recorded image 11 is determined such that it is associated with one region of interest of the object and such that it includes intensity values associated with a location in the neighborhood 27 of the location O1 of the object wherein this location is also associated with the region of interest associated with the image region 23.

The other image regions 23', 25 and 25' are determined in a corresponding manner.

Subsequent to the determination of the image regions 23, 23', 25 and 25', a displacement vector is associated with each of the image regions. In the example of FIG. 1, a displacement vector V1 is associated with the image region 23, a displacement vector having a length of zero is associated with the image region 23', a displacement vector V2 is associated with the image region 25, and a displacement vector of length zero is associated with the image region 25'.

The displacement vector V1 is determined by correlating the image data of the image region 23 with the image data of the image region 23' with the constraint that the displacement vector of the image region 23' has zero length. Similarly, the displacement vector V2 is determined by correlating the image data of the image region 25 with the image data of the image region 25'. Herein, it is possible to determine the displacement vectors according to various other methods. For example, the displacement vectors assigned to the image regions 23 and 23' can be calculated such that a displacement vector having length zero is associated with the image region 23 while a displacement vector having the inverse orientation but the same length as the displacement vector V1 shown in FIG. 1 is associated with the image region 23'. It is also possible to determine the displacement vectors associated with the image regions 23 and 23' such that they have same lengths but opposite directions. Other methods of determining the displacement vectors are possible and can be equally used.

Subsequent to the determination of the displacement vectors associated with to the image regions, the resulting image 21 is generated from the image data of the recorded images 11 and 11', wherein the displacement vectors V1 and V2 are taken into account.

Specifically, the intensity value of the recorded image 11 which is associated with the location O1 at the apex of the triangle 13 and which is located within the region 23 is also associated with a location in the coordinate system of the resulting image 21 having coordinates represented by vector B1 in FIG. 2. This location B1 is calculated based on the displacement vector V1 associated with the image region 23. The same applies for the location at the apex of the triangle 13' in the image region 23' and has a consequence that the intensity values which are associated with separate locations in the coordinate systems of the recorded images 11 and 11' are associated with a same location in the coordinate system of the resulting image 21.

This calculation based on the displacement vectors associated with the image regions is performed for at least one intensity value of the respective image region. It can be advantageous to perform this calculation also for intensity values associated with locations in the neighborhood of such locations. For example, all intensity values belonging to the triangle 13 can be displaced by the displacement vector V1 in order to obtain a representation of the triangle 13" in the representation of the resulting image 21 having high sharpness and low blur.

Similarly, all intensity values belonging to the triangle 15 can be displaced using the displacement vector V2 associated with the image region 25 in order to obtain a correct superposition with the triangle 15' such that a representation of the triangle 15" in FIG. 2 shows a high contrast-to-noise-ratio and low blur.

It is apparent that the representations of features of the object in the resulting image can be very sharp at least for such features located in the closer neighborhood of those regions of interest having associated image regions for which displacement vectors are determined by correlation. In some situations, it may not be possible to determine a sufficient number of regions of interest of the object such that the regions of interest are spaced at sufficiently low distances from each other so that all intensity values of the recorded images are located within the image regions associated with the regions of interest. Such situation may occur, for example, when only a low number of features exist on the object which can be distinguished in the recorded image and which have a sufficiently high contrast such that they are suited for performing a correlation. Moreover, the number of regions of interest of the object can also be reduced in view of a higher performance of the method, since the calculation of a lower number of correlations is involved when the number of regions of interest is lower.

However, it is still possible to obtain representations showing high sharpness and low blur in the resulting image also for image regions of the recorded images which are not contained in the image regions 23, 23', 25, 25'. For example, it is possible to associate also those image regions which are not contained in the image regions 23, 23', 25, 25' with displacement vectors, and to use these displacement vectors when the corresponding image data are combined to form the resulting image 21. This will be illustrated below with reference to the feature of the object which is represented in FIG. 1 as the diamond 14 in the recorded image 11 and the diamond 14' in the recorded image 11'. A displacement vector V3 is associated to the image region containing the diamond 14 in the recorded image 11. The displacement vector V3 is not calculated based on a correlation of image data associated with the image region containing the diamond 14 but by performing an interpolation between the displacement vectors associated with the image regions of the recorded images 11 and 11'. According to a further example, the displacement vector V3 is calculated based on a set of selected basis functions parameterized based on the correlation of the image data.

The diamond 14 is located between the image regions 23 and 25 in the coordinate system of the recorded image 11. It can be assumed that also the displacement vector V3 which can be associated with the image region containing the diamond 14 has a length and a direction between the lengths and directions, respectively, of the displacement vectors V1 and V2 of the image regions 23 and 25. Thus, the displacement vector V3 for the image region containing the diamond 14 can be determined by interpolation between the displacement vectors V1 and V2. Various methods can be used for performing the interpolation. For example, the inverse distance between the location at which the displacement vector is to be calculated by interpolation and the corresponding image region can be used as a weight in the interpolation.

The determination of the displacement vectors by interpolation can be sufficiently accurate in practice while it is still not exact. This is represented in FIG. 2 in that the diamond 14 of FIG. 1 displaced by the displacement vector V3 does not exactly coincide with the diamond 14' of FIG. 1 such that the resulting diamond 14" in the resulting image 21 is a slightly blurred diamond. Still, the resulting image shows less blur compared to conventional methods of combining the images 11 and 11'.

The image region 23 of the recorded image 11 is the first image region of the recorded image 11, and it is associated with the first displacement vector V1. At least one intensity value is, in the resulting image 21, associated with the location B1 in the coordinate system of the resulting image 21, wherein this intensity value is, in the recorded image 11, associated with the first location O1 in the first image region 23 in the coordinate system of the recorded image 11.

The image region 25 of the recorded image 11 is then the second image region of this recorded image 11, and it is associated with the second displacement vector V2. The first displacement vector V1 and the second displacement vector V2 are different from each other. At least one intensity value which is associated with the second location O2 in the second image region 25 in the coordinate system of the recorded image 11 is, in the resulting image 21, associated with the second location B2 in the coordinate system of the resulting image 21.

These determinations are performed such that the following relation is fulfilled:

$$B2-B1=O2+V2-O1-V1$$

In the example illustrated with reference to FIG. 1, the diamond 14 is approximately located between the elements 13 and 15. Moreover, the diamond 14 is located outside each of the image regions 23 and 25. A location of the diamond 14 in FIG. 1 is represented in FIG. 1 by a vector O3. Since the diamond 14 is approximately located between the elements 13 and 15, the following relation holds:

$$|(O2-O1)i|>|(O3-O1)i|.$$

Herein, $(O2-O1)i$ and $(O3-O1)i$ designate the i-th components of the vector differences $(O2-O1)$ and $(O3-O1)$. The i-th component of a vector $Xi$ may be calculated as $Xi=X*ei$, wherein $ei$ designates the i-th unit vector in the coordinate system of the recorded image, and "*" indicates the scalar product.

The intensity value of the recorded image 11 assigned to the location O3 outside of the image regions 23 and 25 is assigned to a location in the resulting image 21 having a coordinate vector B3 shown in FIG. 2 which is calculated based on the displacement vector V3. The displacement vector V3 can be calculated by interpolation such that the following relations hold:

$$B3-B1=O3+V3-O1-V1 \text{ and}$$

$$|(V2-V1)i|>|(V3-V1)i|,$$

wherein, (V2−V1)i and (V3−V1)i are the i-th components of the vector differences (V2−V1) and (V3−V1), respectively.

Displacement vectors can be determined for all image data of the recorded images in analogy to the exemplary displacement vector V3 illustrated above based on the displacement vectors V1 and V2 associated with the image regions. Many interpolation and extrapolation methods, such as spline methods, can be used for this purpose. While the number of regions of interests was two in the above illustrative example, a greater number of regions of interest can be used.

Figure 3:
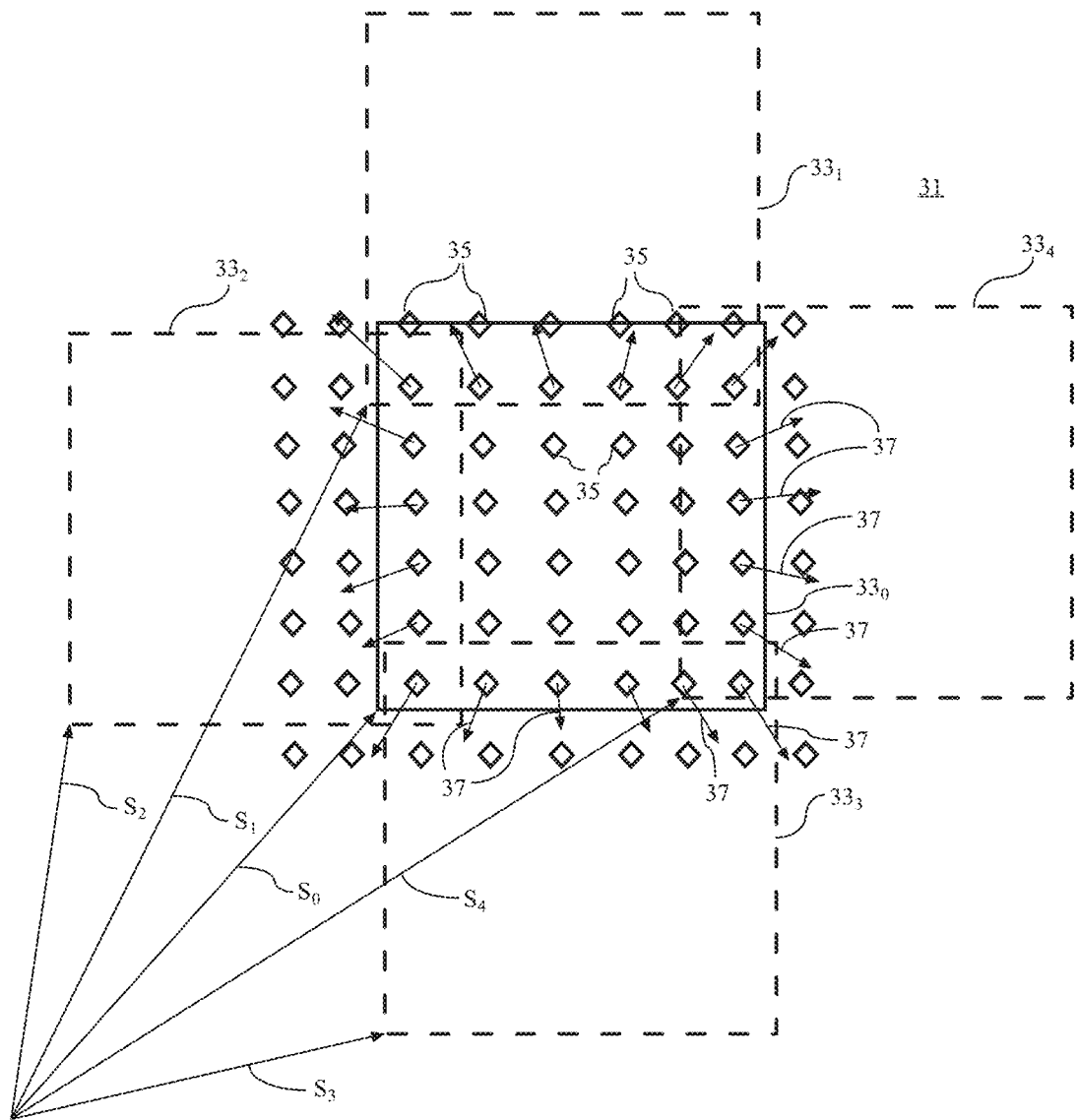
FIG. 3 is a schematic presentation illustrating a further method of recording an image using a particle microscope.

A further embodiment of a method of recording an image using a particle microscope will be illustrated with reference to FIG. 3 below. FIG. 3 is a schematic elevational view of a surface of an object 31. The method is provided for recording an image of the surface 31 using a particle microscope. In this example, the particle microscope is a multi-beam particle microscope directing plural particle beams simultaneously onto the surface of the object. Each particle beam can scan an object region 33 associated with the particle beam. The object regions are of a square shape, and they are arranged adjacent to each other. Pairs of adjacent object regions 33 overlap with each other. This means that a location of the object located close to the edge of one of the object regions 33 is also located close to an edge of an object region arranged adjacent to this object region. Such locations on the surface of the object are scanned by two or three particle beams, accordingly, and these locations are contained in two or three recorded images. FIG. 3 shows one exemplary object regions $33_0$ as a rectangle drawn in full lines, while the four object regions $33_1$, $33_2$, $33_3$ and $33_4$ arranged adjacent to the exemplary object region $33_0$ are shown as rectangles drawn in broken lines.

In the illustrated example, the object regions 33 each have a square shape, and the object regions are arranged in a checkerboard pattern. Other configurations are possible. For example, the object regions may have a rectangular shape such that pairs of their edges have different lengths, for example. Moreover, the object regions may have, for example, a hexagonal shape, wherein the object regions are arranged in a honeycomb pattern.

The particle beams scanning an object region 33 generate signals, such as secondary electrons, which can be detected and assigned to the respective particle beam generating the detected signals. Intensity values can be determined based on the detected signals, wherein the intensity values are associated with that location in the coordinate system of the object on which the particle beam was incident at a time when the detected signal was generated by the particle beam. The sequence of intensity values obtained from the sequence of detected signals provide the image data of the recorded image. Thus, a recorded image may be associated with each object region 33.

Vectors S0, S1, S2, S3 and S4 in FIG. 3 represent position vectors in a coordinate system of the object representing the positions of the object regions $33_0$, $33_1$, $33_2$, $33_3$ and $33_4$, respectively, in the coordinate system of the object. These vectors may have been obtained by a suitable calibration of the particle microscope, for example. It is possible to determine a correspondence between locations in the coordinate system of the recorded image and locations in the coordinate system of the object using these position vectors.

The object has a plurality of salient features 35 which are discernible in the particle microscopic image. These features may be arranged in a regular pattern on the object. A subset of these features located close to the object region $33_0$ are schematically shown as diamonds in FIG. 3. These features form regions of interest for the illustrated method of recording of an image using a particle microscope. The recorded images of the individual object regions 33 will then contain plural image regions, wherein plural image regions can be determined in each recorded image, wherein each image region is associated with a region of interest corresponding to a salient feature 35, and wherein the image region includes intensity values associated with locations within the respective region of interest and within the neighborhood of the respective region of interest. A portion of the regions of interest corresponding to salient features 35 shown in FIG. 3 is located close to the edge of the object region $33_0$ in portions which overlap with the adjacent object regions $33_1$, $33_2$, $33_3$ and $33_4$.

As illustrated above, a displacement vector can be associated with image regions of different images, wherein the different image regions are associated with a same region of interest of the object, and wherein the displacement vector is determined based on a correlation performed on the image regions. Such displacement vectors are represented in FIG. 3 by vectors 37 having an exaggerated length for illustration purposes. The displacement vectors 37 are associated with the image regions of the object region $33_0$ of the recorded image, wherein image regions exist in images of the adjacent object regions $33_1$, $33_2$, $33_3$ and $33_4$ which are associated with the same regions of interest.

The arrangement of the displacement vectors 37 suggests that the imaging of the object region 33o into the recorded image includes an image distortion of a barrel type. On the other hand, the arrangement of the displacement vectors shown in FIG. 3 can be also explained if the central object region $33_0$ is substantially free of distortions and when the adjacent object regions $33_1$, $33_2$, $33_3$ and $33_4$ each have a pincushion distortion. This ambiguity can be resolved by considering all overlapping portions between all pairs of adjacent object regions and by minimizing a total amount of determined displacements.

A displacement vector can be associated with each location in the coordinate system of the recorded image by performing an interpolation or an extrapolation based on the displacement vectors 37. It is, thus possible, to correct the locations associated with the intensity values of the recorded image based on these displacement vectors in order to obtain an image of the object region $33_0$ having a lower distortion.

Such process can be applied to all overlapping portions between all pairs of adjacent object regions 33 of the object in order to determine corrections for the distortions in the images recorded by the plural particle beams. These determined distortion corrections can be used to correct the distortions in the images recorded by the plural particle beams. It is, for example, possible to combine the image data of the individual object regions using the determined distortion corrections and to form an image of high quality of the overall object. The generation of the combined image is not required, however. In applications where a presence of a defect in a semiconductor wafer is to be assessed, for example, it is sufficient to determine the location of a defect on wafer based on a small portion of the image using the determined distortion corrections, while the combined image of the overall object is not explicitly calculated.

In the illustrated example of FIG. 3, the displacement vectors 37 are equally distributed in various directions. The arrangement of the displacement vectors 37 suggests that the image distortion vanishes at the center of the image. In other examples, it may happen that displacement vectors determined by interpolation do not vanish at the center of an image region.

The type of the algorithm used for performing the interpolation and extrapolation can be broadly varied. For example, it may be advantageous to determine displacement vectors assigned to image regions such that one component of the displacement vectors has a predetermined value of zero, for example. When a particle beam is scanned across the object along horizontal scan lines, for example, the coordinate system of the recorded image can be selected such that one unit vector of the coordinate system is parallel to the scan lines. It is then possible to determine the displacement vectors such that those components which correspond to the unit vector not oriented parallel to the scan lines have a value of zero. This can be achieved, for example, by projecting the displacement vector determined by a two-dimensional correlation onto the unit vector oriented parallel to the scan lines. Thereafter, the displacement vectors determined based on the correlation of the image data are then oriented parallel to the scan lines. Similarly, the displacement vectors determined by interpolation or extrapolation from these displacement vectors of the image regions are oriented in this direction. Specifically, the displacement vectors associated with the image regions and the displacement vectors determined by interpolation or extrapolation will be parallel to each other. Such method is particularly advantageous for compensating scan distortions occurring in image recording methods in which the particle beam is scanned across the object.

Figure 4:
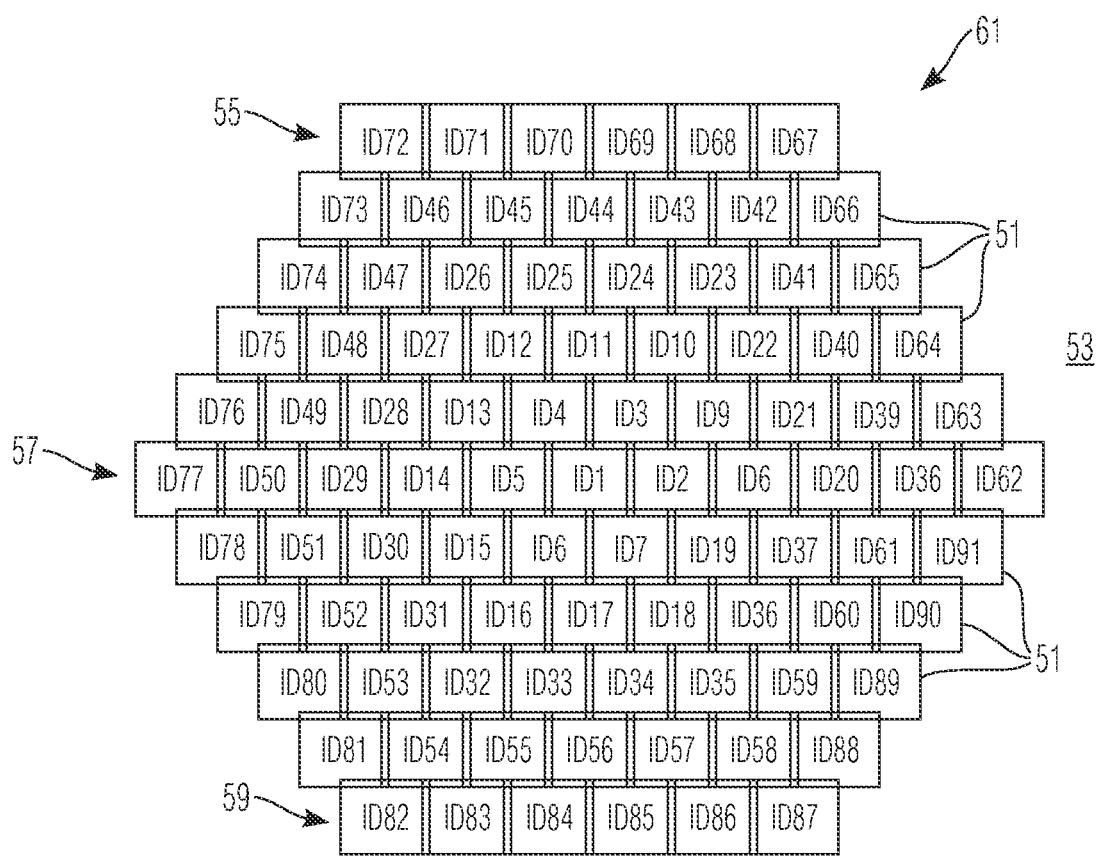
FIG. 4 is an elevational view of an object surface illustrating object regions scanned by an array of particle beams in a multi-beam particle microscope.

FIG. 4 is an elevational view of an object surface illustrating object regions scanned by an array of particle beams in a multi-beam particle microscope.

The multi-beam particle microscope generates an array of plural particle beams. The particle beams are scanned across the object such that each individual beam is scanned across a rectangular object region 51. Each object regions has, in the example illustrated in FIG. 4, a height of 10 μm and a width of 12 μm on the object surface 53. Adjacent beams of the array of plural particle beams are scanned across object regions 51 which are adjacent to each other on the object surface 53. Herein, object regions 51 scanned by adjacent particle beams overlap by some amount as will be illustrated further below.

An image associated with each object region 51 can be generated by scanning the array of particle beams across the plural object regions 51. The plural images can be generated simultaneously by commonly deflecting the bundle of particle beams of the array of particle beams so that the object regions 51 are scanned in parallel.

The object regions 51 which can be simultaneously scanned using the multi-beam particle microscope are arranged in a pattern corresponding to the pattern of the array of particle beams. In the illustrated example, the multi-beam particle microscope uses 91 particle beams, and the object regions 51 are arranged in lines, wherein a top line 55 includes six object regions 51. The number of object regions 51 per line is increased by one from line to line until a central line 57 includes eleven object regions 51. From there on, the number of object regions 51 per line is decreased by one until a bottom line 59 again has six object regions 51.

A portion 61 of the object surface 53 which can be simultaneously scanned using the 91 beams has a substantially hexagonal shape having stepped boundaries.

Figure 5:
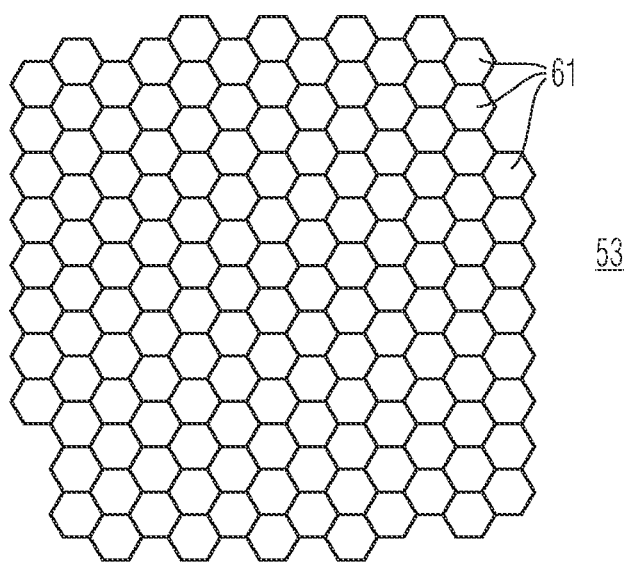
FIG. 5 is an elevational view of an object surface, similar to FIG. 4, illustrating a method of imaging a larger portion of the object surface.

FIG. 5 is an illustration of an extended portion of the object surface 53 which is scanned by translating the object surface 53 relative to the electron microscope between each recording of 91 images of the corresponding object regions 51. It is apparent that the object surface 53 can be translated relative to the particle microscope such that the hexagonal portions 61 cover the full surface 53 of the object such that images of extended portions of the object surface 53 can be obtained by the illustrated procedure.

Background information relating to multi-beam particle microscopes is shown in U.S. Pat. No. 9,536,702 B2 and further literature cited therein.

In the illustrated example, the object region 51 scanned by a single beam has a size of 10 μm×12 μm. A pixel size used in the imaging is 2 nm on the object surface 53. The recorded image of one object region has 13,000,000 pixels, accordingly. In the example, the color depth used to store the image data is 8 bits, such that the image data associated with one image amounts to 30 MB. Since the number of beams is 91, the image data of one simultaneous scan of one object portion 61 amounts to 2.73 GB. The duration of one simultaneous scan is one second such that the time to scan 1 mm² of the object surface 53 is 2.35 hours, and the amount of image data generated is 22.75 TB.

It is apparent that the processing of these amounts of data within the given time is challenging. Herein, it is to be noted that the image data have to run through intensive image processing pipelines before the images of the individual object regions 51 can be stitched together to form an overall image of an extended object region as shown in FIG. 5.

There are situations where it is not necessary to display the overall image, if, for example, only defects in a semiconductor are to be detected. However, also in such situations, the distortions of the individual images can be determined and corrected for. In semiconductor applications, a distortion primarily results in a shift of the features away from their positions expected based on the design of the circuit. The distortion correction has to restore the original positions with an accuracy which is better than one fifth of the feature size, for example. If the features are contact holes of 40 nm, this accuracy corresponds to better than 8 nm corresponding to 4 pixels, assuming a pixel size of 2 nm.

Figure 6A:
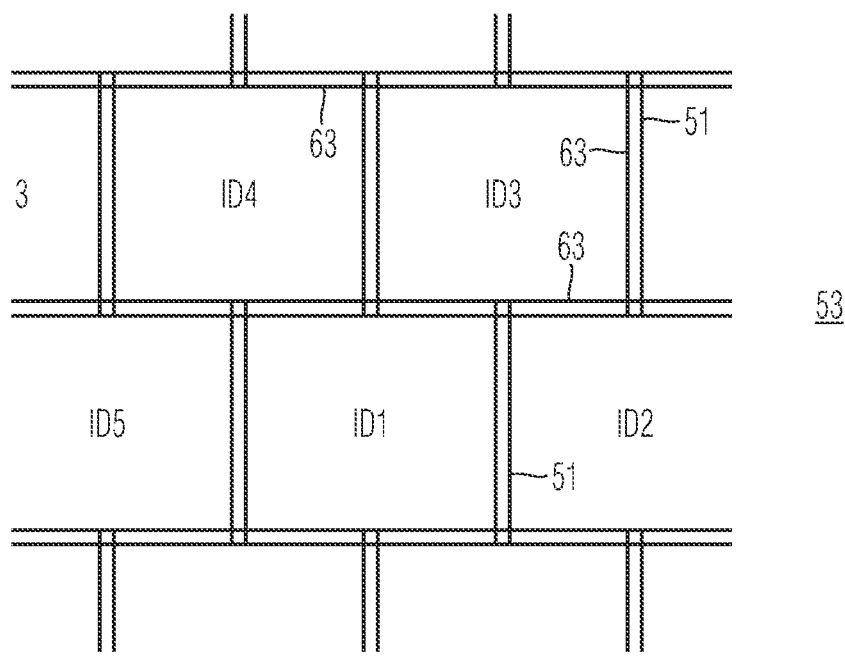
FIG. 6A is a schematic illustration of a detail of FIG. 4.

FIG. 6A is an elevational view of the object surface 53 illustrating a detail of FIG. 4. Adjacent object regions 51 overlap by a certain amount such that each adjacent pair of object regions 51 scanned by a corresponding pair of adjacent particle beams share an overlapping portion 63 on the object surface 53.

Figure 6B:
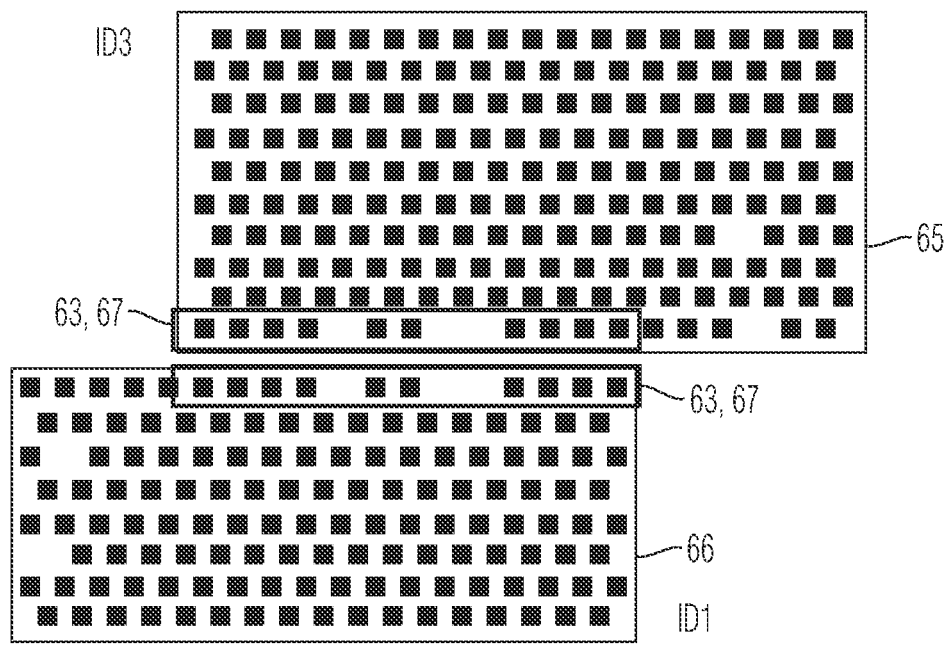
FIG. 6B is an illustration of images of an exemplary object corresponding to object regions shown in FIG. 6A.

FIG. 6B shows portions of two images 65 and 66 of an exemplary object recorded by the particle microscope.

The upper image 65 shown in FIG. 6B is the lower portion of the image obtained from the surface portion 51 labeled "ID3" in FIG. 6A, and the lower image 66 shown in FIG. 6B is the upper portion of the image recorded from the object region 51 labeled "ID1" in FIG. 6A. Each of the images 65 and 66 includes an image portion 67 which is an image of an overlapping portion 63 between adjacent object regions 51 on the object surface 53.

Figure 7A:
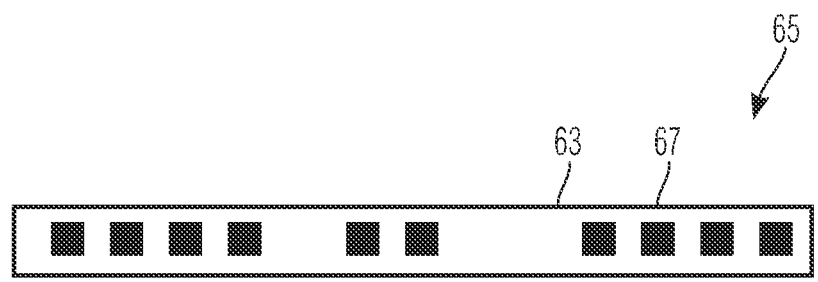
FIG. 7A is an enlarged view of an overlapping portion in the upper image shown in FIG. 6B.
Figure 7B:
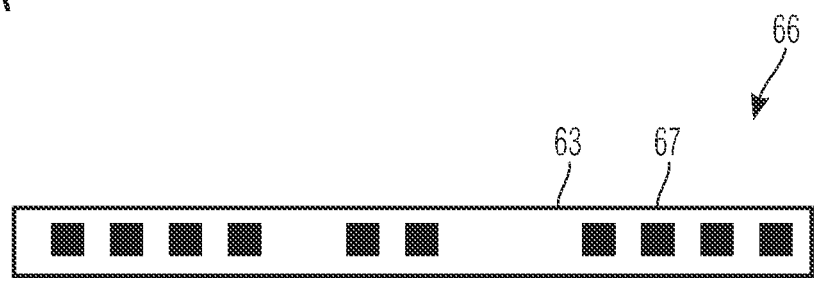
FIG. 7B is an enlarged view of an overlapping portion of the lower image shown in FIG. 6B.

FIG. 7A is an enlarged view of the image portion 67 of the upper image 65 shown in FIG. 6B, and FIG. 7B is an enlarged view of the image portion 67 of the lower image 66 shown in FIG. 6B.

Figure 7C:
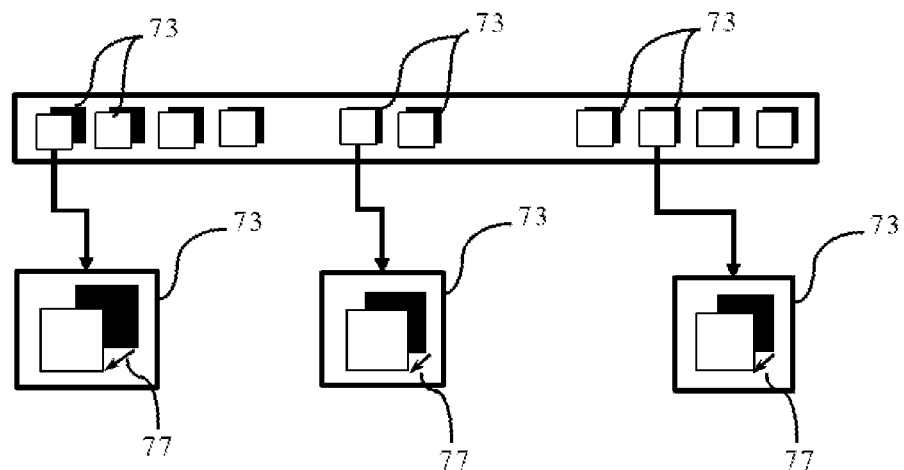
FIG. 7C shows a difference image of the images shown in FIGS. 7A and 7B and of enlarged portions of the difference image.

FIG. 7C shows a difference image 71 obtained by subtracting the intensity values of the image portion 67 shown in FIG. 7A from the intensity values of the image portion 67 shown in FIG. 7B.

Plural overlapping object portions 73 can be defined and selected within the overlapping portion 63 on the object surface 53.

FIG. 7C shows an exemplary number of three overlapping object portions 73, and enlarged views 75 of these overlapping object portions 73. Each of the enlarged views 75 includes a representation of a displacement vector 77 representing the displacements between the overlapping object portions 73 between the two images 65 and 66. The displacement vectors 77 can be determined based on a correlation between the image data associated with the overlapping object portions 73 in the two images 65 and 66.

Figure 7D:
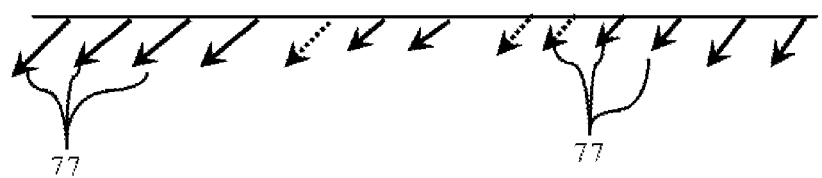
FIG. 7D is a representation of displacement vectors determined based on the images shown in FIGS. 7A and 7B.

FIG. 7D is a graphic representation of plural displacement vectors 77 determined by correlating the plural overlapping object portions 73 of the overlapping portion 63 between adjacent object regions 51. Herein, the displacement vectors obtained from the three overlapping object portions 73 shown in FIG. 7C are represented by arrows drawn by a solid line, while displacement vectors obtained from additional overlapping object portions not shown in FIG. 7C are drawn by broken lines. In the illustrated example, the number of displacement vectors 77 obtained per overlapping object region is nine. A higher or lower number of overlapping object portions 73 can be used to determine a higher or lower number of displacement vectors 77.

Each object region 51 includes a periphery of overlapping portions 63, and a plurality of displacement vectors 77 distributed around this periphery can be determined as illustrated above. The ensemble of the displacement vectors 77 distributed around the periphery of the image of the object region 51 is indicative of image distortions of the imaging of the object region 51 into the image associated with this object region 51. In other words, the displacement vectors 77 or data derived from these displacement vectors or data representing the displacement vectors distributed around the periphery of an image represent a "fingerprint" of the image distortion included in the overlapping images.

Figure 8A:
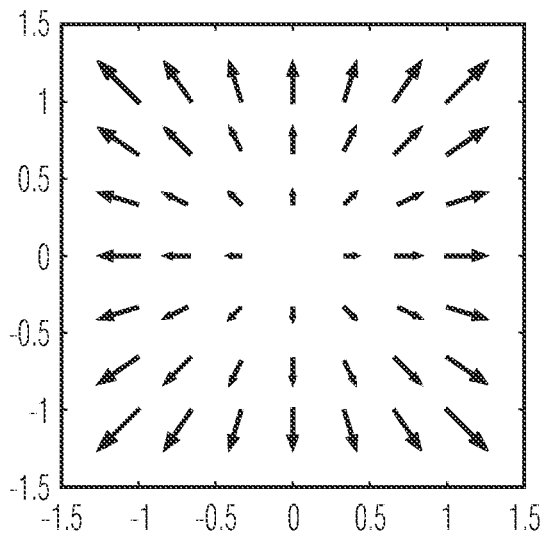
FIGS. 8A, 8B, 8C and 8D show illustrative representations of image distortions which can be determined based on displacement vectors as illustrated in FIG. 7D.
Figure 8B:
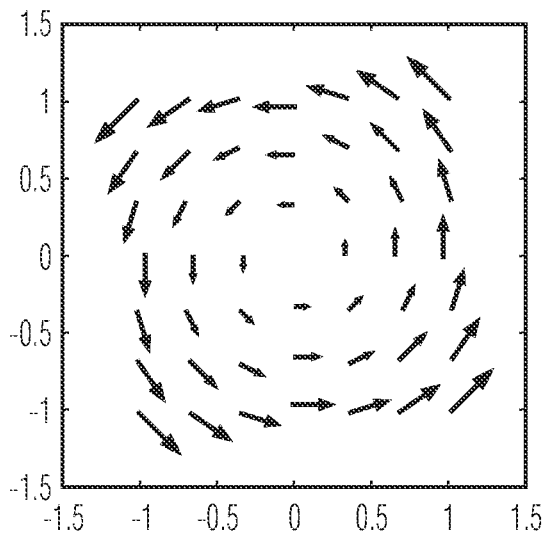
Figure 8C:
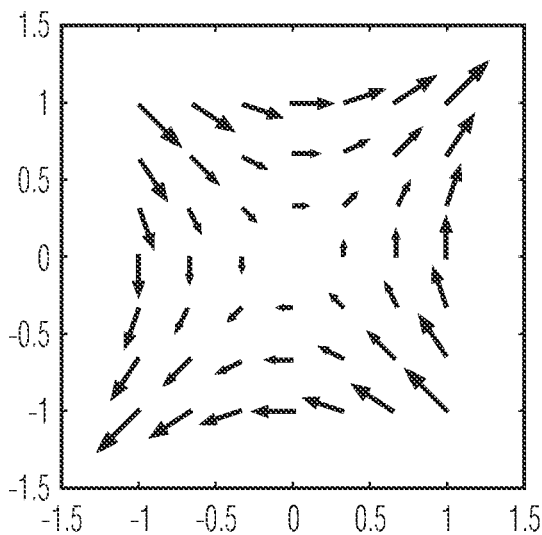
Figure 8D:
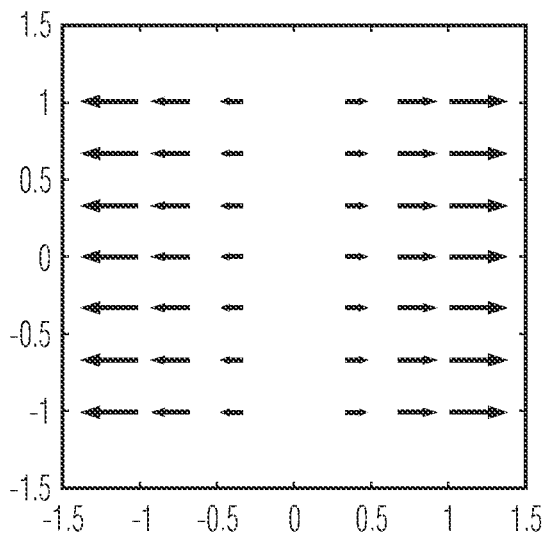

FIGS. 8A, 8B, 8C and 8D show illustrative representations of exemplary image distortions which can be determined based on the displacement vectors 77 distributed about the periphery of an image. FIG. 8A shows an image distortion originating from a scale error, FIG. 8B shows an image distortion originating from a rotation error, and FIG. 8C shows an image distortion originating from a shear error occurring in the imaging. Moreover, FIG. 8D shows a quadratic distortion which cannot be represented by an affine transformation. This distortion is an example of distortions originating from inaccuracies of the beam scanning system.

It is possible to use a set of suitably selected basis functions for correcting the images for distortions. Herein, it may be considered that all image distortions have to be calculated in one optimization process since the displacement vectors 77 originate from common overlapping portions of the images. A distortion correction method may adapt the weights of the basis functions per image in all the images until the resulting displacement vector fingerprint 77 substantially vanishes or arrives at a minimum. Usually, there will be remaining residual displacement vectors which can be either eliminated by adding more correction degrees of freedom by extending the basis function set or which can be acceptable if the distribution of the residual displacement vectors has a width of its standard deviation which is below a threshold of, for example, 2 pixels.

It is apparent that an image distortion can be determined for each image of each object region 51. These image distortions can be considered when a combined resulting image is generated based on the images of the object regions 51.

Figure 9:
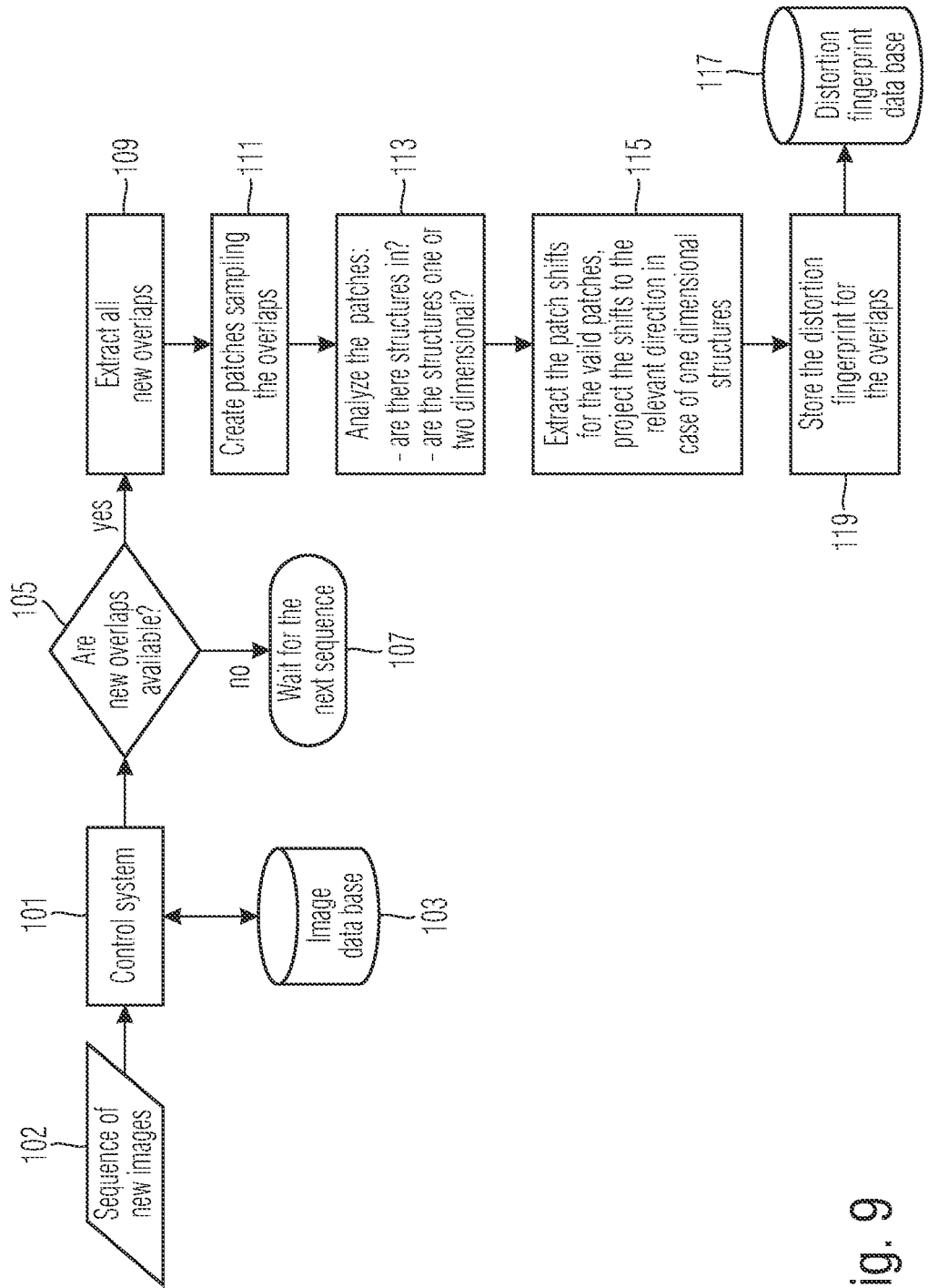
FIG. 9 is a flow chart illustrating an embodiment of a method of recording images using a multi-beam particle microscope.

FIG. 9 shows a flow chart illustrating an embodiment of a method of recording images using a multi-beam particle microscope. Specifically, in a main process 102, the array of particle beams of the particle microscope is simultaneously scanned across the object regions 51 in order to obtain images of these object regions 51. A control system 101 stores the recorded images in an image database 103. The stored images can be analyzed or further processed at a later time. Such further processing of the images may include a stitching of the images to form a greater combined resulting image. As illustrated above, it can be advantageous to generate the combined resulting image based on determined image distortions of the individual images. The determination of the image distortion includes expensive calculations such as the determination of displacement vectors 77 based on a correlation between pairs of image portions. These calculations involve a significant amount of computing time which can be of a same or similar order as the time involved for recording the images using the particle microscope in some operation conditions.

Assuming that the individual surface portions 51 are each scanned with a same scan strategy, such as a top-down line scan, it is apparent that some of the plural overlapping object portions 77 are scanned earlier than other overlapping object portions 77.

In the method illustrated in FIG. 9, a computation step 105 determines whether a next overlapping object portion 77 has been scanned by two adjacent particle beams. If the answer is no, the process waits in a step 107. If the answer is yes, the overlapping object portions 77 which became available so far are extracted from the recorded image data in a step 109. The image portions corresponding to the overlapping object portions 77 are created as "patches" in a step 111. These image portions are analyzed in a step 113 in order to determine whether they are suitable to be used for the determination of a displacement vector 77. For example, an image portion showing no structure at all will not be useful. Therefore, step 113 determines whether the image portions include structures originating from features on the object and whether these structures have orientations allowing to determine displacement vectors of a desired range of orientations.

The displacement vectors 77 corresponding to the useful overlapping object portions 75 are determined in a step 115 and stored in a database 117 in a step 119. The displacement vectors 77 are indicative of the image distortions of the individual images and can be used at a later time when the images stored in the image database 103 are analyzed.

Figure 10:
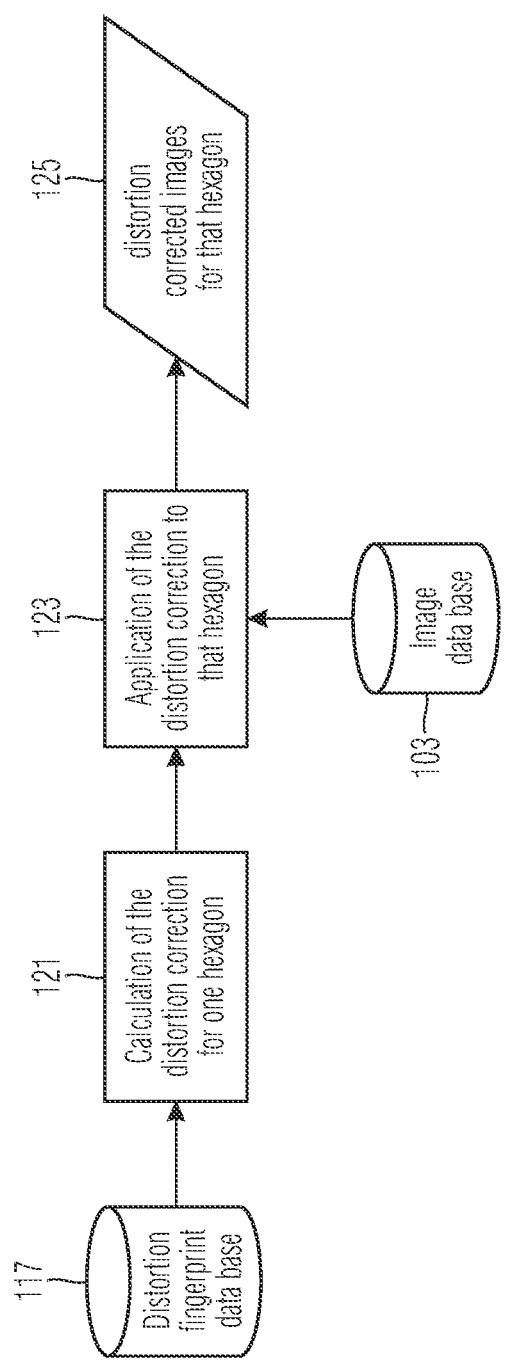
FIG. 10 is a flow chart illustrating a further embodiment of a method of recording images using a multi-beam particle microscope.

This process is illustrated in more detail in the flowchart shown in FIG. 10. Based on the displacement vectors 77 stored in the database 117, the image distortion of each image of an object region 51 can be determined in a step 121. The image distortions relate to the ensemble of all object portions 51 which can be simultaneously scanned using the array of particle beams. The images of the hexagonal surface portion 61 can be stitched together in a step 123 based on this information, and a corresponding combined resulting image can be output in a step 125.

Assuming that the image distortions associated with the individual particle beams remain sufficiently constant for a certain time, it is possible to omit the calculation of displacement vectors for some recorded hexagonal surface portions 61 and to use the previously determined image distortions in the generation of the combined resulting image. Thus, the image distortions associated with the individual particle beams can be determined in regular intervals, such as whenever the next, for example, 10, 20, 50 or 100 hexagons have been scanned, such that significant computing time can be saved.

What is claimed is:

1. A method, comprising:
scanning an array of particle beams across a surface of an object, wherein each particle beam is scanned across one surface portion of plural surface portions, wherein each surface portion of the plural surface portions overlaps with at least one adjacent other surface portion of the plural surface portions, and wherein each surface portion of the plural surface portions, including its regions overlapping with other surface portions, is scanned by one particle beam;
generating plural images, wherein each image of the plural images is generated based on detected signals generated by one particle beam while it is scanned across one surface portion so that each image of the plural images is an image of one surface portion of the plural surface portions;
correlating image data of pairs of a first image of the plural images and a second image of the plural images, wherein the image data of the first image comprise an image feature which is an image of a given object feature on the object, and wherein the image data of the second image comprise an image feature which is an image of the given object feature on the object; and
based on the correlated image data, determining image distortions of the plural images.

2. The method of claim 1, comprising correlating the image data for at least 100 pairs of first and second images of the plural images.

3. The method of claim 1, further comprising, based on the plural images and the determined image distortions, generating a combined resulting image.

4. The method of claim 3, wherein:
scanning the array of particle beams across the surface of the object comprises detecting signals generated by each particle beam;
the image data comprise a plurality of intensity values;
the intensity values of each image of the pairs of first and second images are determined based on the detected signals generated by one particle beam of the array of particle beams;
each intensity value is associated with a location in a coordinate system of the image and with a location on the object;
generating the combined resulting image comprises associating at least one intensity value of a given image feature with a location in the coordinate system of the combined resulting image; and
the location in the coordinate system of the combined resulting image is determined based on the displacement vector associated with the given image feature.

5. The method of claim 1, further comprising based on the plural images and the determined image distortions, determining a location on the object corresponding to image data of at least one of the plural generated images.

6. The method of claim 5, wherein the object comprises a semiconductor circuit, and the location on the object comprises a defect of the semiconductor circuit.

7. The method of claim 1, wherein the image data of the first image comprise plural image features which are images of plural given object features on the object, and the image data of the second image comprise plural image features which are images of the plural given object features on the object.

8. The method of claim 7, wherein a number of the plural image features is greater than five, and a number of the plural object features is at least greater than five.

9. The method of claim 1, wherein:
scanning the array of particle beams, generating the plural images and correlating of image data are performed a first time and a second time; and
correlating the image data the first time is started prior to scanning the array of particle beams the second time.

10. The method of claim 9, wherein correlating the image data the first time is completed prior to scanning the array of particle beams the second time.

11. The method of claim 1, wherein correlating the image data comprises determining a displacement vector associated with the image feature, and determining the image distortions of the plural images is based on the determined displacement vector.

12. The method of claim 1, further comprising predetermining positions of the object features in the coordinate system of the object.

13. The method of claim 1, further comprising determining positions of the object features based on an analysis of the plural images.

14. The method of claim 13, further comprising:
based on the detected signals, determining the intensity values of each image of the plural images; and
based on scan positions of the particle beams occurring during scanning, determining the locations in the coordinate system of each image of the plural images associated with the intensity values.

15. The method of claim 1, comprising correlating the image data for at least 100 pairs of first and second images of the plural images, and further comprising, based on the plural images and the determined image distortions, generating a combined resulting image.

16. The method of claim 1, comprising correlating the image data for at least 100 pairs of first and second images of the plural images, and further comprising, based on the plural images and the determined image distortions, determining a location on the object corresponding to image data of at least one of the plural generated images.

17. The method of claim 1, comprising correlating the image data for at least 100 pairs of first and second images of the plural images, wherein the image data of the first image comprise plural image features which are images of plural given object features on the object, and the image data of the second image comprise plural image features which are images of the plural given object features on the object.

18. The method of claim 1, comprising correlating the image data for at least 100 pairs of first and second images of the plural image, wherein:
scanning the array of particle beams, generating the plural images and correlating of image data are performed a first time and a second time; and
correlating the image data the first time is started prior to scanning the array of particle beams the second times.

19. The method of claim 1, comprising correlating the image data for at least 100 pairs of first and second images of the plural images, wherein correlating the image data comprises determining a displacement vector associated with the image feature, and determining the image distortions of the plural images is based on the determined displacement vector.

20. The method of claim 1, comprising correlating the image data for at least 100 pairs of first and second images of the plural images, and further comprising predetermining positions of the object features in the coordinate system of the object.

21. The method of claim 1, comprising correlating the image data for at least 100 pairs of first and second images of the plural images, and further comprising determining positions of the object features based on an analysis of the plural images.

22. The method of claim 1, further comprising based on the plural images and the determined image distortions:
generating a combined resulting image; and
determining a location on the object corresponding to image data of at least one of the plural generated images.

23. The method of claim 1, further comprising, based on the plural images and the determined image distortions, generating a combined resulting image, wherein the image data of the first image comprise plural image features which are images of plural given object features on the object, and the image data of the second image comprise plural image features which are images of the plural given object features on the object.

24. The method of claim 1, further comprising, based on the plural images and the determined image distortions, generating a combined resulting image, wherein:
scanning the array of particle beams, generating the plural images and correlating of image data are performed a first time and a second time; and
correlating the image data the first time is started prior to scanning the array of particle beams the second time.

25. The method of claim 1, further comprising, based on the plural images and the determined image distortions, generating a combined resulting image, wherein correlating the image data comprises determining a displacement vector associated with the image feature, and determining the image distortions of the plural images is based on the determined displacement vector.

26. The method of claim 1, further comprising:
based on the plural images and the determined image distortions, generating a combined resulting image; and
predetermining positions of the object features in the coordinate system of the object.

* * * * *

UNITED STATES PATENT AND TRADEMARK OFFICE
CERTIFICATE OF CORRECTION

PATENT NO. : 11,728,130 B2
APPLICATION NO. : 17/220519
DATED : August 15, 2023
INVENTOR(S) : Dirk Zeidler et al.

It is certified that error appears in the above-identified patent and that said Letters Patent is hereby corrected as shown below:

In the Drawings

Sheet 1 of 8, delete "Fig 1" insert -- Fig. 1 --.

Sheet 1 of 8, delete "Fig 2" insert -- Fig. 2 --.

Sheet 2 of 8, delete "Fig 3" insert -- Fig. 3 --.

Sheet 5 of 8, delete "Fig 7C" insert -- Fig. 7C --.

Sheet 5 of 8, delete "Fig 7D" insert -- Fig. 7D --.

In the Specification

Column 14, Line 37, delete "$33_o$," insert -- $33_0$ --.

Signed and Sealed this
Seventeenth Day of October, 2023

*Katherine Kelly Vidal*

Katherine Kelly Vidal
*Director of the United States Patent and Trademark Office*